United States Patent
Fedan (10) Patent No.: US 8,169,279 B2
(45) Date of Patent: May 1, 2012

(54) NOTCHED SAW IMAGE FREQUENCY REJECTION FILTER SYSTEM

(75) Inventor: Orest Fedan, Belmont, MA (US)

(73) Assignee: Lojack Operating Company, LP, Canton, MA (US)

( * ) Notice: Subject to any disclaimer, the term of this patent is extended or adjusted under 35 U.S.C. 154(b) by 378 days.

(21) Appl. No.: 12/589,431

(22) Filed: Oct. 23, 2009

(65) Prior Publication Data
US 2011/0095850 A1    Apr. 28, 2011

(51) Int. Cl.
H03H 9/64    (2006.01)
H03H 9/52    (2006.01)
H04B 1/12    (2006.01)

(52) U.S. Cl. ......... 333/193; 333/194; 455/285; 455/302

(58) Field of Classification Search .......... 333/193–196, 333/133; 310/313 R, 313 B, 313 C, 313 D; 455/78, 82, 285, 296, 302–306
See application file for complete search history.

(56) References Cited

U.S. PATENT DOCUMENTS

| | | | |
|---|---|---|---|
| 5,559,481 A | | 9/1996 | Satoh et al. |
| 6,924,715 B2 * | | 8/2005 | Beaudin et al. ............... 333/133 |
| 7,362,384 B2 * | | 4/2008 | Dauphinee et al. .......... 348/725 |
| 7,412,217 B2 * | | 8/2008 | Boos ............................ 455/129 |
| 7,456,705 B2 * | | 11/2008 | Ito ................................ 333/133 |
| 7,602,264 B2 * | | 10/2009 | Itou et al. ....................... 333/193 |
| 7,623,837 B2 * | | 11/2009 | Cathelin et al. ............... 455/307 |
| 2004/0032706 A1 | | 2/2004 | Kemmochi et al. |
| 2004/0196119 A1 | | 10/2004 | Shibahara et al. |
| 2004/0233019 A1 | | 11/2004 | Inoue et al. |
| 2005/0104685 A1 | | 5/2005 | Kuroki et al. |

OTHER PUBLICATIONS

International Searching Authority, Written Opinion of the International Searching Authority for International Application No. PCT/US2010/002418, dated Feb. 22, 2012, 7 pgs. (unnumbered).

* cited by examiner

*Primary Examiner* — Barbara Summons
(74) *Attorney, Agent, or Firm* — Iandiorio Teska & Coleman, LLP (57) ABSTRACT

A notched SAW image frequency rejection filter system includes a SAW filter having an input, an output and a ground output and an impedance matching network including a first matching inductance connected to the SAW filter output and a second matching inductance connected to the ground output of the SAW filter; the SAW filter having an inherent internal capacitance that produces a predetermined capacitive leakage current at the image frequency; an inherent internal inductance that produces an inductance leakage current at the image frequency; and a boosted inherent parasitic ground inductance at the ground output of the SAW filter for generating a voltage across the second matching inductance to produce a compensation current which is substantially opposite in phase and substantially matched in magnitude with the capacitive leakage current for reducing the capacitive leakage current and increasing the image frequency rejection.

12 Claims, 6 Drawing Sheets

*FIG. 1*

(PRIOR ART)

NOTCHED SAW IMAGE FREQUENCY REJECTION FILTER SYSTEM

FIELD OF THE INVENTION

This invention relates to a notched SAW image frequency rejection filter system.

BACKGROUND OF THE INVENTION

Superheterodyne radio receivers achieve good sensitivity and selectivity by mixing the signal received by the antenna (which has a frequency $f_{RF}$) with a local oscillator (which has a frequency $f_{LO}$). What is meant by mixing is that the two are multiplied together. Mathematically, this results in the production of signals at additional frequencies: for example at the sum of the two frequencies and at the difference between the two frequencies. It is the signal at the difference of the two frequencies $f_{IF}$ which is important as it is a much lower frequency and thus can be filtered more easily. The problem with this method is that there are two frequencies at the antenna which produce the same difference frequency: one is higher in frequency than $f_{LO}$ and one is lower in frequency than $f_{LO}$. Since only one of these is desired to be received, the other (called the image) must be filtered out prior to the mixing operation. It is convenient for the difference frequency $f_{IF}$ to be as low as possible. For this reason, it has become common to use SAW filters to filter out the image because of their sharp filtering properties. However, the ultimate attenuation which SAW filters provide is usually not enough and other filtering must be added to supplement them, which forces $f_{IF}$ to be higher than desirable. One possible solution is to use multiple stages of SAW filtering (and amplification to overcome the loss in the SAW filter) but this increases size and cost and degrades the intermodulation rejection properties of the receiver. Another possible solution is to use an image reject mixer, but this also increases size (unless it is integrated into a chip), cost and current consumption.

SUMMARY OF THE INVENTION

In accordance with various aspects of the subject invention in at least one embodiment the invention presents an improved notched SAW image frequency rejection filter system which may use only a single stage filter preserving smaller size and lower cost while attaining a substantial increase in filter response and low IF.

The subject invention results from the realization, in part that, an improved notched SAW image frequency rejection filter system in various aspects can be achieved by adding external coupling between the input and output pins of the SAW filter to counteract the internal coupling such that at the image frequency the external coupling is the same level but opposite in phase to the internal coupling, thus resulting in cancellation of coupling at the image frequency, and thus a much higher ultimate attenuation at the image frequency.

The subject invention, however, in other embodiments, need not achieve all these objectives and the claims hereof should not be limited to structures or methods capable of achieving these objectives.

This invention features a notched SAW image frequency rejection filter system including a SAW filter having an input, an output and a ground output, and an impedance matching network including a first matching inductance connected to the SAW filter output and a second matching inductance connected to the ground output of the SAW filter. The SAW filter has an inherent internal capacitance that produces a predetermined capacitive leakage current at the image frequency; an inherent internal inductance that produces an inductance leakage current at the image frequency; and a boosted inherent parasitic ground inductance at the ground output of the SAW filter for generating a voltage across the second matching inductance to produce a compensation current which is substantially opposite in phase and substantially matched in magnitude with the capacitive leakage current for reducing the capacitive leakage current and increasing the image frequency rejection.

In preferred embodiments the compensation current may be greater than the capacitive leakage current and the system further may include a boost leakage capacitance connected across the SAW filter input and output for increasing the capacitive leakage current to match the compensating current. The SAW input and output may include input and output terminal pins, respectively, and the spacing, length and diameter of the terminal pins may determine the value of the boost leakage capacitance. The boost inductance value may be determined by the length and widths of the conductor connecting the boost ground inductance to ground. The SAW filter may be implemented in a surface mount construction and the boost ground inductance value may be determined by the length and width of the conductor connecting the boost ground inductance to ground. The SAW filter may be implemented in a surface mount construction and the boost capacitance may be determined by boost capacitance etched conductors length and spacing.

This invention also features a notched SAW image frequency rejection filter system including a SAW filter having an input, an output and a ground output and an impedance matching network including a first matching inductance connected to the SAW filter output and a second matching inductance connected to the ground output of the SAW filter. The SAW filter has an inherent internal capacitance that produces a predetermined capacitive leakage current at the image frequency, an inherent internal inductance that produces an inductance leakage current at the image frequency, and an inherent parasitic ground inductance at the ground output of the SAW filter for generating a voltage across the second matching inductance which has a reduced inductance value for producing a compensation current which is substantially opposite in phase and substantially matched in magnitude with the capacitive leakage current for reducing the capacitive leakage current and increasing the image frequency rejection In preferred embodiments the compensation current may be greater than the capacitive leakage current and the system may further include a boost leakage capacitance connected across the SAW filter input and output for increasing the capacitive leakage current to match the compensating current. The SAW input and output may include input and output terminal pins, respectively, and the spacing length and diameter of the terminal pins may determine the value of the boost leakage capacitance. The parasitic ground inductance value may be determined by the length and width of the conductor connecting the parasitic ground inductance to ground. The SAW filter may be implemented in a surface mount construction and the parasitic ground inductance value may be determined by the length and width of the conductor connecting the parasitic ground inductance to ground. The SAW filter may be implemented in a surface mount construction and the boost capacitance may be determined by boost capacitance etched conductors lengths and spacings.

BRIEF DESCRIPTION OF THE SEVERAL VIEWS OF THE DRAWINGS

Other objects, features and advantages will occur to those skilled in the art from the following description of a preferred embodiment and the accompanying drawings, in which.

DETAILED DESCRIPTION OF THE INVENTION

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

This invention describes a technique for improving the attenuation of a SAW filter at the image frequency allowing the use of a low $f_{IF}$ with only one SAW filter required to filter out the image. The SAW filter is a very well known filter device using surface acoustic wave technology for the filtering. Assuming that the SAW filter does not have any spurious responses at the image frequency the ultimate attenuation of the SAW is determined by the coupling which occurs within the package of the SAW filter. In accordance with this invention external coupling between the input and the output of the SAW filter is added to counteract the internal coupling at the image frequency. The external coupling is at substantially the same level and is substantially opposite in phase to the internal coupling. This results in a substantial offset or cancellation of the coupling at the image frequency and a much higher ultimate attenuation at the image frequency.

SAW filters typically require a high inductive impedance at their input and output in order to have minimum loss and good filtering characteristics.

Figure 1:
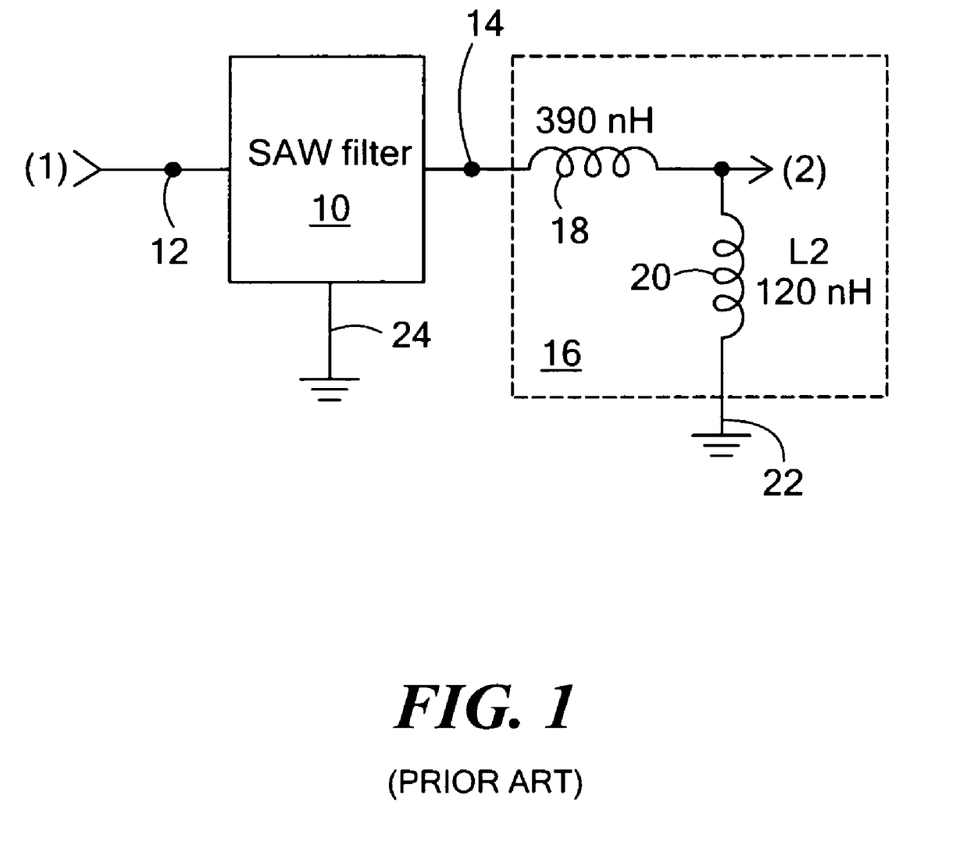
FIG. 1 is a schematic diagram of a prior art SAW filter system including a matching circuit.

There is shown in FIG. 1 a conventional SAW filter 10 whose input 12 impedance is typically 225 ohms-j375 ohms and whose output 14 is connected to a matching circuit 16 including, for example, matching inductances 18 and 20. Inductance 20 is connected to ground at 22. SAW filter 10 has a ground connection 24 as well.

Figure 2:
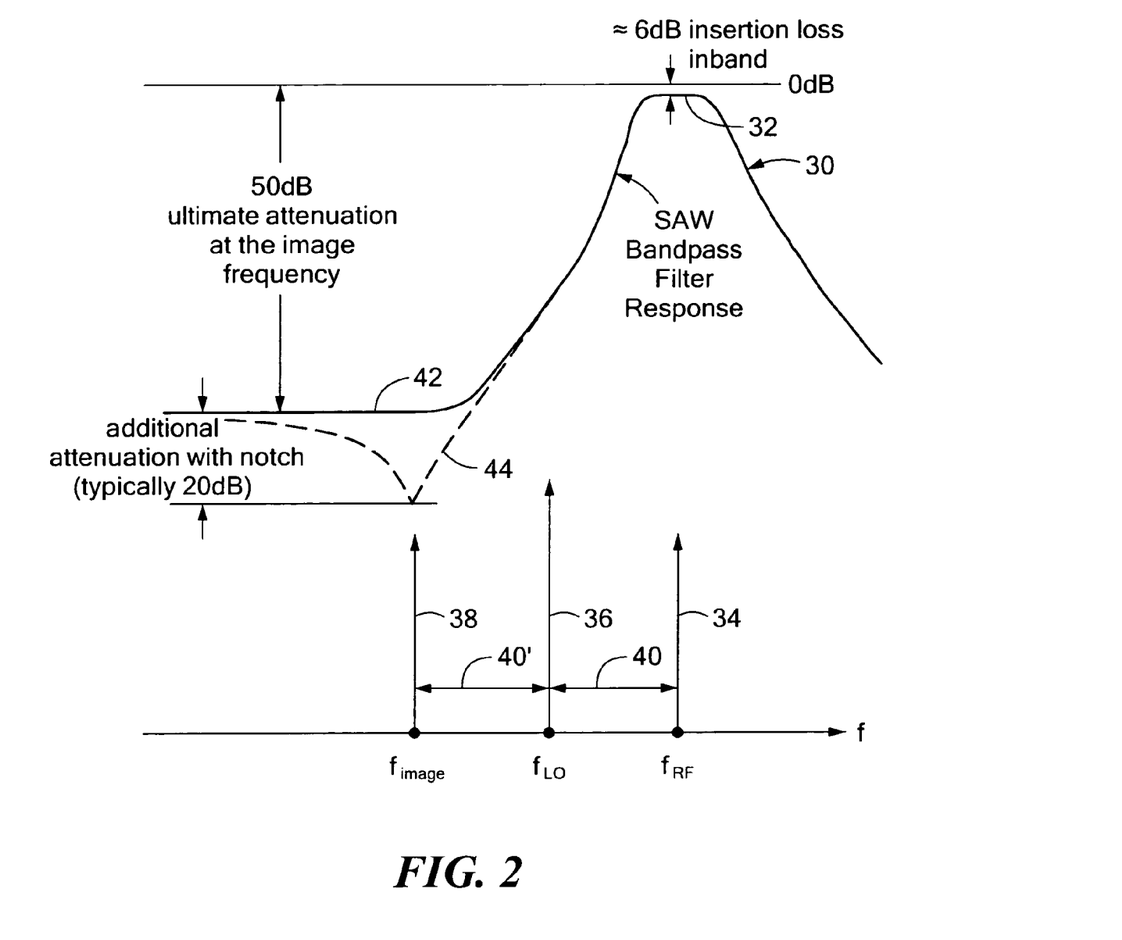
FIG. 2 is the band pass filter response for the system of FIG. 1 and showing the improved notched response achievable with a notched SAW image frequency rejection filter system according to this invention.

A band pass filter response 30, FIG. 2, for a conventional SAW filter peaks at 32 at the RF frequency, $f_{RF}$ 34, with only a small insertion loss of typically 60 dB. The local oscillator frequency, $f_{LO}$, appears at 36 and the image frequency, $f_{image}$, appears at 38. The local oscillator frequency 36 is separated from the RF frequency 34 by a specific difference frequency indicated at 40. At any given time the signals on the antenna are likely to include a frequency which is the same distance 40' below the local oscillator frequency $f_{LO}$ 36 as the RF, frequency $f_{RF}$ 34 is above it. This second frequency is known as the image frequency or $f_{image}$ 38. The presence of this second, image, frequency 38 interferes with proper filtering and processing and for this reason it is sought to be suppressed as much as possible. As can be seen in FIG. 2 at 42 the suppression is significant, in the prior art, approximately 50 dB down. However, in accordance with this invention, a further suppression of the image frequency can be effected as indicated at 44 where, with the notch afforded by this invention, the attenuation of the image frequency is down approximately another 20 dB or more.

Figure 3:
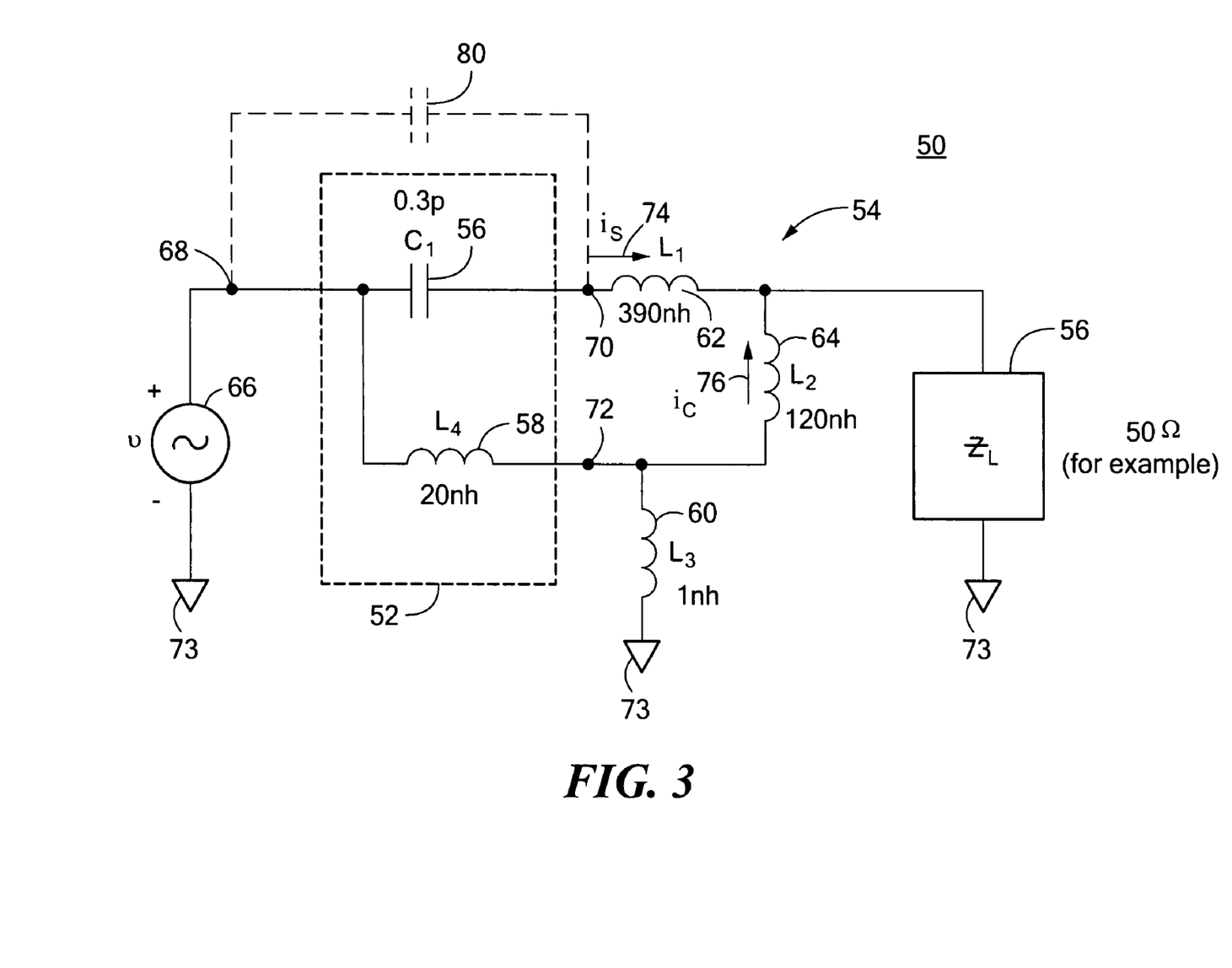
FIG. 3 is a schematic diagram of a notched SAW image frequency rejection filter system according to this invention.

One embodiment of the notched SAW image frequency rejection filter system 50, FIG. 3, according to invention includes a SAW filter 52 and matching circuit 54 which feed a load 56, typically a 50 ohm impedance load. SAW filter 52 is not shown in detail as it is a well known device, a surface acoustic wave filter. What is shown inside the box is simply the equivalent circuit indicating the inherent internal capacitance 56 and the inherent internal leakage inductance 58. Also associated with SAW filter 52 is an inherent parasitic ground inductance 60. Impedance matching circuit 54 includes matching inductances 62 and 64. SAW filter 52 receives voltage v from some source 66 at the SAW input 68 referenced to common ground reference 73 and provides a signal at its output 70. Also associated with SAW filter 52 is a ground output 72. Inherent internal capacitance 56 provides a leakage current $i_s$ 74 through inductance 62 which limits the ultimate attenuation in prior art devices. However, in system 50 according to an embodiment of this invention the leakage current from inherent internal inductance 58 occurring at ground output 72 develops a voltage across inherent parasitic ground inductance 60. This voltage appears across matching inductance 64 and develops a compensation current $i_c$ 76. In one embodiment ground inductance 60 would be sought to be decreased as much as possible. However, in this embodiment ground inductance 60 is increased in order to increase the voltage across matching inductance 64 to increase current $i_c$ 76 so that it generally matches capacitive leakage current $i_s$ 74. This results in the increased drop 44, FIG. 2, at the notch providing the additional attenuation of 20 dB or more.

Alternatively, instead of increasing ground inductance 60, matching inductance 64 may be decreased. However, there are limitations to how far matching inductance 64 can be decreased. For it is a part of impedance matching circuit 54 and it is limited by the necessity to perform the matching function required of it. For if it does not, the band pass response will be compromised. If compensation current $i_c$ 76 is less than required then either approach can be increased, that is, matching inductance 64 can be decreased if permissible, or ground inductance 60 may be increased. However if the matching is over compensating, that is the compensation current $i_c$ 76 is greater than the capacitive leakage current $i_s$ 74 then a boost capacitance 80 can be added to more nearly balance the current. The current from inherent internal inductance 58 is typically much greater than that required to compensate for capacitive leakage current $i_s$ 74, but that current is applied as indicated to ground inductance 60 which develops a voltage sufficient to develop the offsetting compensation current $i_c$ 76 through matching inductance 64. This compensation current $i_c$ 76 nicely offsets the capacitive leakage current $i_s$ 74 with the values of capacitance and inductance shown in FIG. 3 at the image frequency, e.g. 172 MHz.

Figure 4:
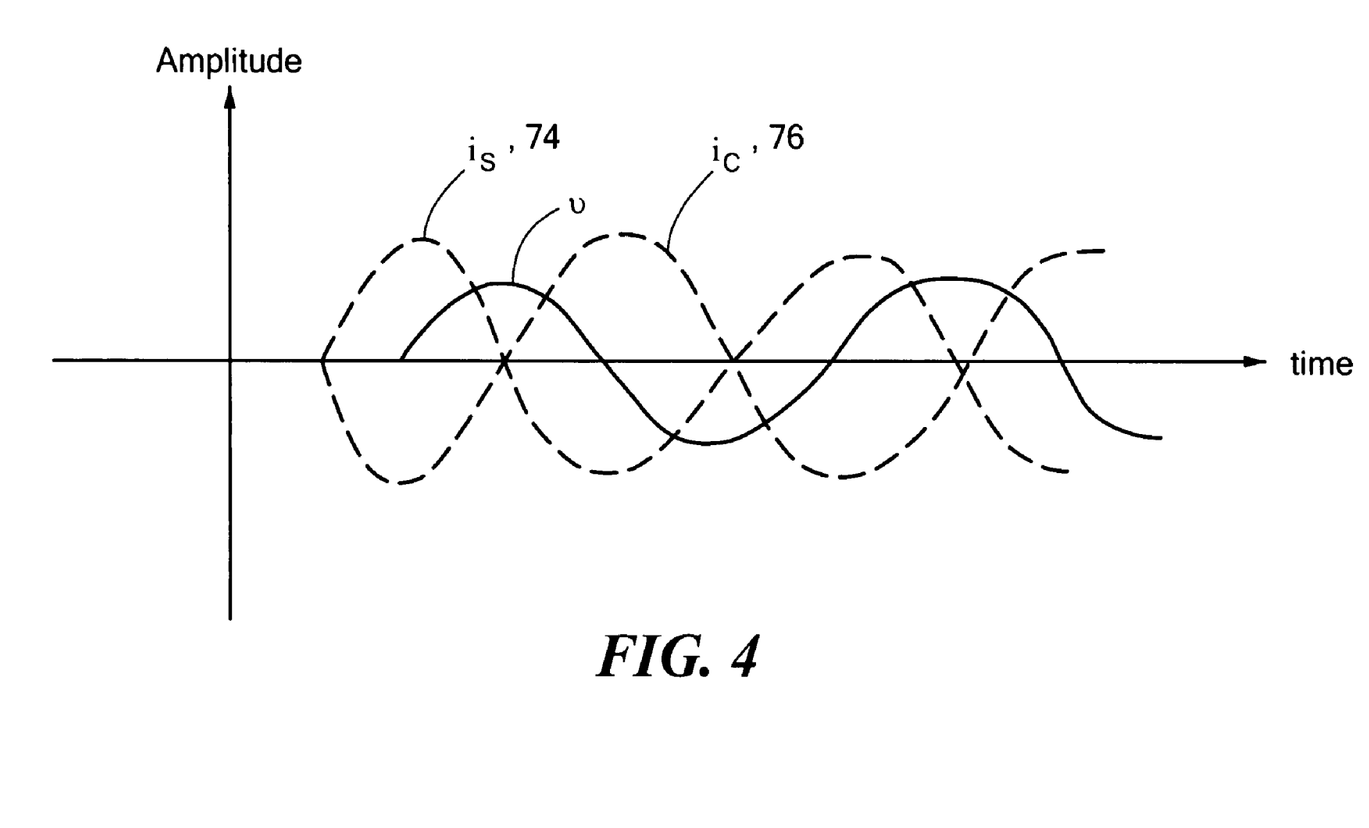
FIG. 4 illustrates the waveforms of input voltage, capacitive leakage current and compensation current achieved according to this invention.

Compensation current $i_c$ 76, FIG. 4, typically is substantially out of phase with capacitive leakage current 74. Since a SAW filter is a narrow band device there is no need for the matching networks to be wideband. The problem is to get the magnitude of compensation current $i_c$ 76 high enough to offset the capacitive leakage current $i_s$ 74. As can be seen the capacitive leakage current $i_s$ 74 is a leading current with respect to the input voltage v whereas the compensation current $i_c$ 76 lags voltage v.

Figure 5:
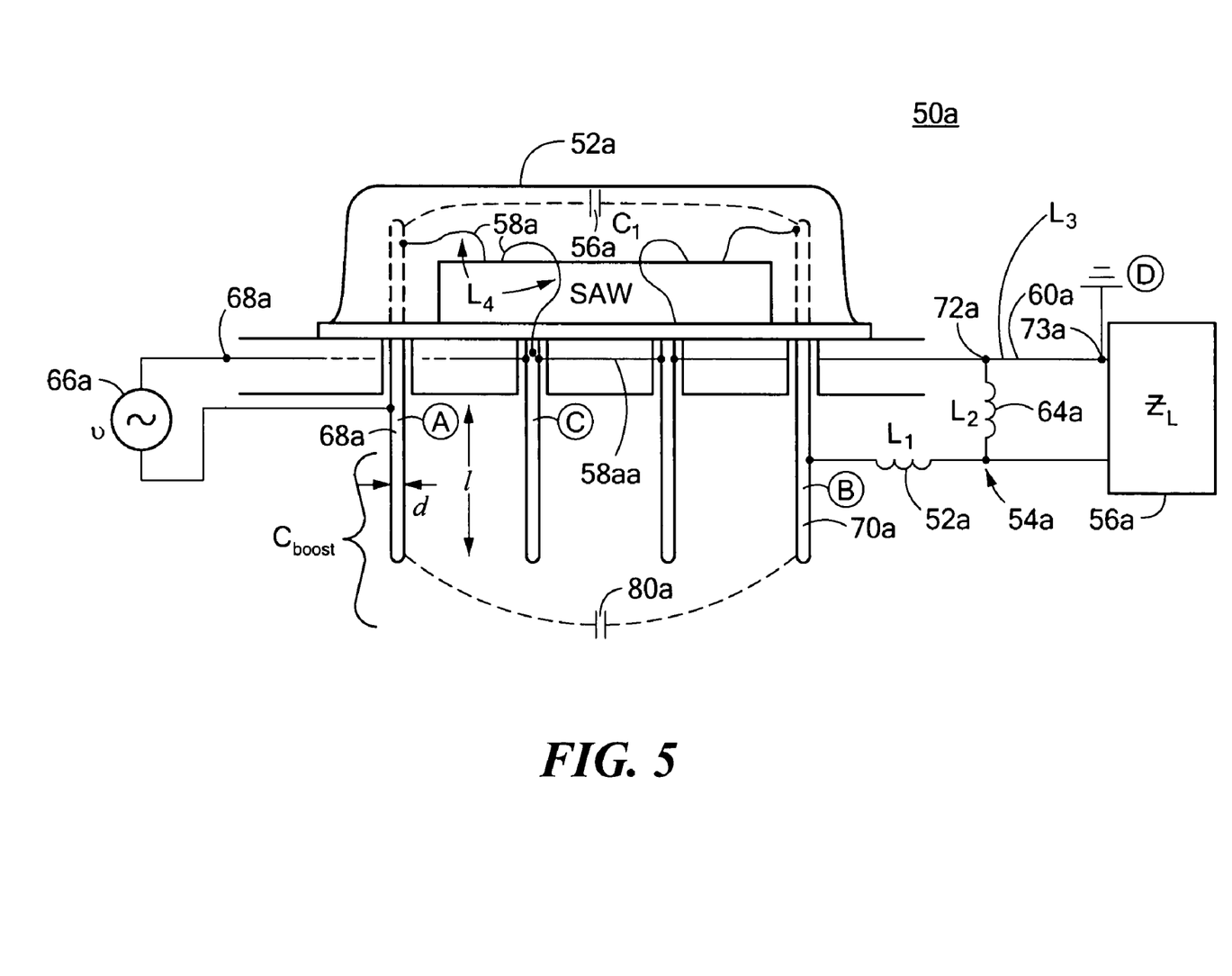
FIG. 5 is a schematic, diagrammatic, side, sectional view of a through hole or leaded package implementation of a notched SAW image frequency rejection filter system according to this invention.

The invention may be embodied in a through hole or leaded package as shown in FIG. 5 where similar parts have been given like numbers accompanied by a lower case a There it can be seen that the inherent internal parasitic inductance is embodied in the leads 58a as they extend further through conductors 58aa to output 72a. Boost ground inductance 60a is implemented by a conductor that connects from output 72a to ground output 73a. The boost capacitance 80a is implemented by the input 68a terminal pin and output terminal pin 70a. It is the length and the diameter of terminal pins 68a and 70a which determines the area of the capacitor "plates" and thus the capacitance. Making them longer or larger will increase the capacitance of the boost capacitance 80a. In this way, with only minor changes the system can be tuned to provide the notched increased attenuation illustrated by 44 in FIG. 2. By simply lengthening or shortening or enlarging or slimming terminal pins 68a and 70a boost capacitance 80a can be controlled. Likewise by tailoring the length and width of conductors 58a and 58aa the inherent internal parasitic conductance can be varied. The ground inductance 60a can be varied by varying the length and width of conductor 60a. The inductance increases as the length of the conductor 60a is increased and decreases as the width of the conductor is increased.

Figure 6:
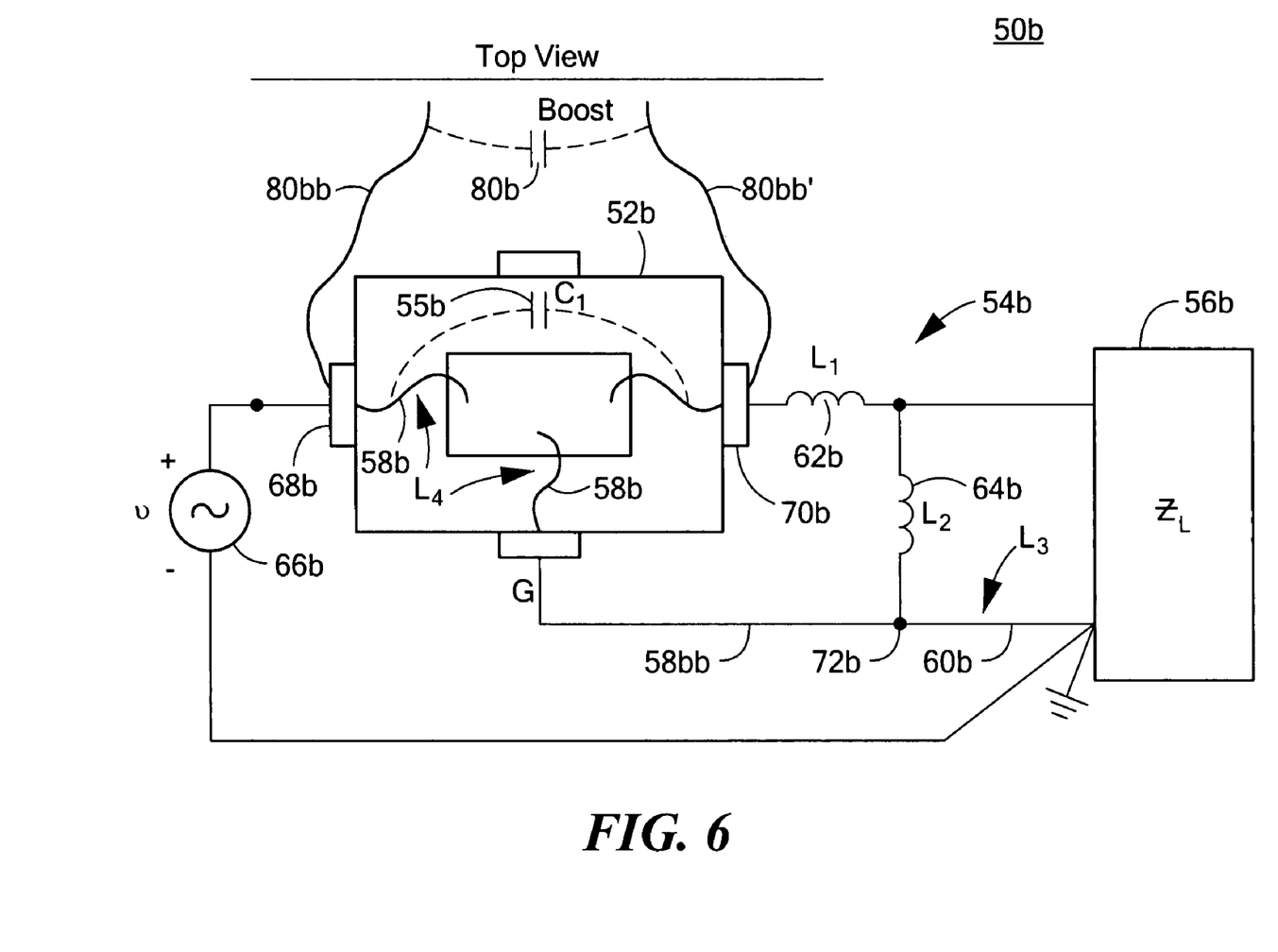
FIG. 6 is a schematic, diagrammatic plan view of a surface mount implementation of a notched SAW image frequency rejection filter system according to this invention.

The invention is not limited to a through hole and lead implementation or any particular implementation. For another example, in a surface mount application, FIG. 6, a notched SAW image frequency rejection filter system according to this invention can be implemented in a surface mount application. As shown by system 50b, FIG. 6, where similar parts have been given like numbers accompanied by a lower case b. Again, the inherent internal inductance can be implemented by leads 58b as well as 58bb and ground inductance 60 can be implemented by leads 60b. Boost capacitance 80b may be implemented using leads 80bb and 80bb' whose length, width and spacing are used to tailor the value of boost capacitance 80b.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

Other embodiments will occur to those skilled in the art and are within the following claims.

What is claimed is:

1. A notched SAW image frequency rejection filter system comprising:
    a SAW filter having an input, an output and a ground output;
    an impedance matching network including a first matching inductance connected to said SAW filter output and a second matching inductance connected to said ground output of the said SAW filter;
    said SAW filter having an inherent internal capacitance that produces a predetermined capacitive leakage current at the image frequency; an inherent internal inductance that produces an inductance leakage current at the image frequency; and a boosted inherent parasitic ground inductance at said ground output of said SAW filter for generating a voltage across said second matching inductance to produce a compensation current which is substantially opposite in phase and substantially matched in magnitude with said capacitive leakage current for reducing said capacitive leakage current and increasing the image frequency rejection.

2. The notched SAW image frequency rejection filter system of claim 1 in which said compensation current is greater than said capacitive leakage current and said system further includes a boost leakage capacitance connected across said SAW filter input and output for increasing the capacitive leakage current to match said compensating current.

3. The notched SAW image frequency rejection filter system of claim 2 in which said SAW input and output include input and output terminal pins, respectively, and the spacing, length and diameter of said terminal pins determine the value of said boost leakage capacitance.

4. The notched SAW image frequency rejection filter system of claim 2 in which said SAW filter is implemented in a surface mount construction and said boost capacitance is determined by boost capacitance etched conductors length and spacing.

5. The notched SAW image frequency rejection filter system of claim 1 in which said boost inductance value is determined by the length and widths of the conductor connecting said boost ground inductance to ground.

6. The notched SAW image frequency rejection filter system of claim 1 in which said SAW filter is implemented in a surface mount construction and said boost ground inductance value is determined by the length and width of the conductor connecting said boost ground inductance to ground.

7. A notched SAW image frequency rejection filter system comprising:
    a SAW filter having an input, an output and a ground output;
    an impedance matching network including a first matching inductance connected to said SAW filter output and a second matching inductance connected to said ground output of the said SAW filter;
    said SAW filter having an inherent internal capacitance that produces a predetermined capacitive leakage current at the image frequency; an inherent internal inductance that produces an inductance leakage current at the image frequency; and an inherent parasitic ground inductance at said ground output of said SAW filter for generating a voltage across said second matching inductance which has a reduced inductance value for producing a compensation current which is substantially opposite in phase and substantially matched in magnitude with said capacitive leakage current for reducing the capacitive leakage current and increasing the image frequency rejection.

8. The notched SAW image frequency rejection filter system of claim 7 in which said compensation current is greater than said capacitive leakage current and said system further includes a boost leakage capacitance connected across said SAW filter input and output for increasing the capacitive leakage current to match said compensating current.

9. The notched SAW image frequency rejection filter system of claim 8 in which said SAW input and output include input and output terminal pins, respectively, and the spacing length and diameter of said terminal pins determine the value of said boost leakage capacitance.

10. The notched SAW image frequency rejection filter system of claim 8 in which said SAW filter is implemented in a surface mount construction and said boost capacitance is determined by boost capacitance etched conductors lengths and spacings.

11. The notched SAW image frequency rejection filter system of claim 7 in which said parasitic ground inductance value is determined by the length and width of the conductor connecting said parasitic ground inductance to ground.

12. The notched SAW image frequency rejection filter system of claim 7 in which said SAW filter is implemented in a surface mount construction and said parasitic ground inductance value is determined by the length and width of the conductor connecting said parasitic ground inductance to ground.

* * * * *